United States Patent [19]
Ando

[11] Patent Number: 5,740,787
[45] Date of Patent: Apr. 21, 1998

[54] ELECTRIC CIRCUIT DEVICE HAVING AN EXCELLENT SEALING CONSTRUCTION

[75] Inventor: Koji Ando, Kariya, Japan

[73] Assignee: Denso Corporation, Kariya, Japan

[21] Appl. No.: 772,765

[22] Filed: Dec. 24, 1996

[30] Foreign Application Priority Data

Dec. 27, 1995 [JP] Japan .................... 7-340417

[51] Int. Cl.$^6$ .................................................. F02P 11/00
[52] U.S. Cl. .................................................. 123/635
[58] Field of Search ...................... 123/635, 647, 123/634; 427/96; 257/787, 788; 156/56; 174/52.4, 58, 226, 233, 399

[56] References Cited

U.S. PATENT DOCUMENTS

| | | | |
|---|---|---|---|
| 4,198,943 | 4/1980 | Worz | 123/635 |
| 4,392,473 | 7/1983 | Tsutsui et al. | 123/635 |
| 4,706,638 | 11/1987 | Johansson et al. | 123/647 |
| 4,863,536 | 9/1989 | Heidenhain et al. | 156/56 |
| 5,165,956 | 11/1992 | Wong | 427/96 |
| 5,218,936 | 6/1993 | Pritz et al. | 123/635 |
| 5,275,841 | 1/1994 | Wong | 427/96 |
| 5,482,123 | 1/1996 | Collee | 175/58 |
| 5,557,066 | 9/1996 | Rostoker et al. | 174/52.4 |
| 5,641,996 | 6/1997 | Omoya et al. | 257/787 |
| 5,641,997 | 6/1997 | Ohta et al. | 257/788 |

FOREIGN PATENT DOCUMENTS

| | | | |
|---|---|---|---|
| 6-27939 | 7/1994 | Japan | 123/635 |
| 6-317243 | 11/1994 | Japan | 123/635 |

*Primary Examiner*—Raymond A. Nelli
*Attorney, Agent, or Firm*—Nixon & Vanderhye, P.C.

[57] ABSTRACT

An igniter circuit is placed inside the sealing container of an associated ignition device to be sealed. The circuit is accommodated behind a partition wall inside the sealing container. The igniter includes a metallic circuit case, a substrate attached to the inner bottom surface of the circuit case, circuit elements attached to the substrate to form an ignition circuit and silicone gel that fills the circuit case. Using the adhesive properties of the silicone gel, a sheet-like protective member is place over the silicone gel to face the partition wall. The protective member may be made, for example, of aramid paper. The protective member is preferably adhesive to silicone gel, can contain gas (air) and is elastic. When the sealing container is filled with insulating resin, a portion of the insulating resin flows to the igniter from an opening of the partition wall. At this point, the protective member protects and separates the silicone gel from the inflowing insulating resin.

27 Claims, 4 Drawing Sheets

5,740,787

ELECTRIC CIRCUIT DEVICE HAVING AN EXCELLENT SEALING CONSTRUCTION

CROSS REFERENCE TO RELATED APPLICATION

This application is based on and claims priority from Japanese Patent Application No. 7-340417, the contents of which are incorporated herein by reference.

BACKGROUND OF THE INVENTION

1. Field of the Invention

The present invention relates to an electric circuit device sealed with a gel such as silicone gel.

2. Description of Related Art

Japanese Examined Utility Model Publication No. 6-27939 discloses a conventional gel seal construction for protecting an electric circuit from external elements. Here, the electric circuit portion of a device (for example, an ignition circuit for an internal combustion engine) is accommodated inside a circuit housing. The circuit housing is filled with silicone gel for sealing the entire electric circuit portion. Silicone gel is used as the sealing material because of its excellent fluidity when it is poured into the circuit housing which fluidity enables it to reach every corner of the circuit housing to seal up all circuit elements. Furthermore, the silicone gel is highly elastic even after it is cured. In addition, silicone gel is thermally stable even if it is subjected to high temperatures and so, it protects the electric circuit from external heat.

According to the above-described publication, an opening of the circuit housing filled with silicone gel is blocked by a cover to protect the silicone gel. Then, this circuit housing is placed inside a coil housing which houses an ignition coil. The coil housing is then filled up with epoxy resin.

However, in the above-described prior art construction, the opening of the circuit housing must be completely blocked by the cover to effectively protect the silicone gel. This need to seal the opening of the circuit housing using the cover is troublesome and makes the process of assembling the electrical circuit device inside the coil housing difficult.

SUMMARY OF THE INVENTION

It is a primary object of the present invention to provide an electric circuit device having a sealing construction which eliminates the need for the prior art type of cover for the circuit housing opening. The new sealing construction enables easier assembly of the sealed electric circuit device inside another circuit housing still effectively sealing it.

To achieve the above-mentioned object, one aspect of the present invention provides an electric circuit device which includes a container, a circuit element, a gel medium and a protective member. The container has an opening. The circuit element is placed inside the container via the opening. The gel medium fills the container to seal the circuit element. The protective member contacts an entire surface of the gel medium proximate to the opening. This protective member is for sealing the gel medium. In this way, there is no need to provide a mechanical cover for sealing the container opening to protect the gel medium and, ultimately, the circuit element from external elements. The protective member seals the gel medium which, in turn, seals the circuit element.

Preferably, the protective member is adhesive to the gel medium, contains gas and is elastic. For example, when the gel medium is silicone gel, the protective member may be made up of aramid paper.

BRIEF DESCRIPTION OF THE DRAWINGS

Additional objects and advantages of the present invention will be more readily apparent from the following detailed description of a preferred embodiment thereof when taken together with the accompanying drawings in which.

DETAILED DESCRIPTION OF PRESENTLY PREFERRED EXEMPLARY EMBODIMENT

A preferred embodiment of the present invention is hereinafter described with reference to the accompanying drawings, with respect to a case in which the present invention is applied to an ignition device for an internal combustion engine.

Figure 1:
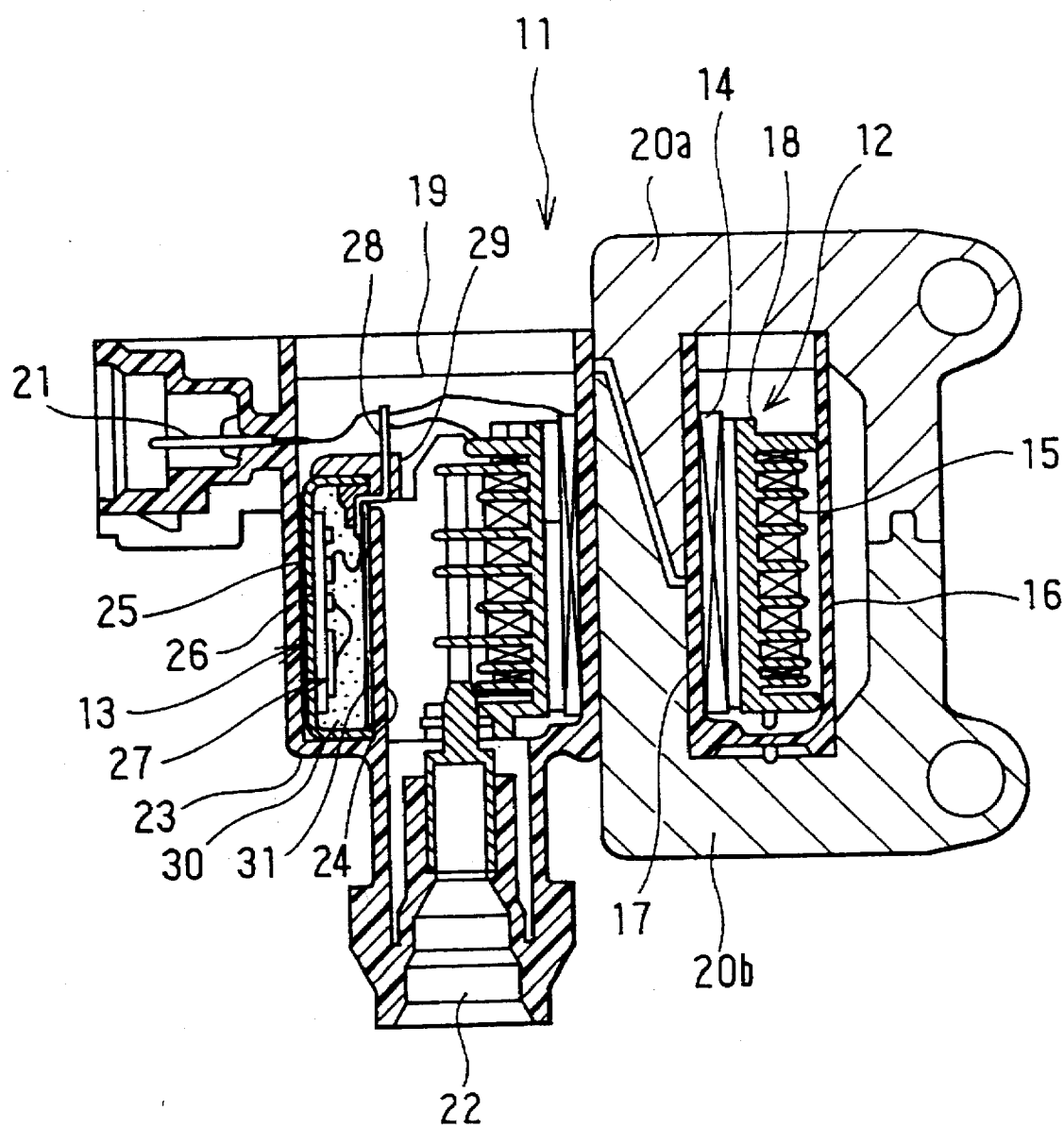
FIG. 1 is a vertical cross-sectional view of an ignition device according to an embodiment of the present invention.

As shown in FIG. 1, the ignition device 11 is formed by integrating an ignition coil 12 and an igniter (driver circuit) 13. The ignition coil 12 includes a primary coil 14 and a secondary coil 15 which is disposed at the periphery of the primary coil 14. The primary coil 14 and the secondary coil 15 are housed in a sealing container 16 made of resin. The primary coil 14 is press-fitted onto the periphery of a penetrating cylindrical portion 17 which is integrally formed with the sealing container 16. This penetrating cylindrical portion 17 penetrates the sealing container 16 in an axial direction. The secondary coil 15 is wound around a secondary spool 18. Iron cores 20a and 20b are press-fitted into the penetrating cylindrical portion 17. The internal sections of these cores 20a, 20b are connected to each other via the penetrating cylindrical portion 17. The sealing container 16 has a primary terminal 21 that is connected to the igniter 13 and a secondary terminal 22 that is connected to the secondary coil 15.

Figure 2:
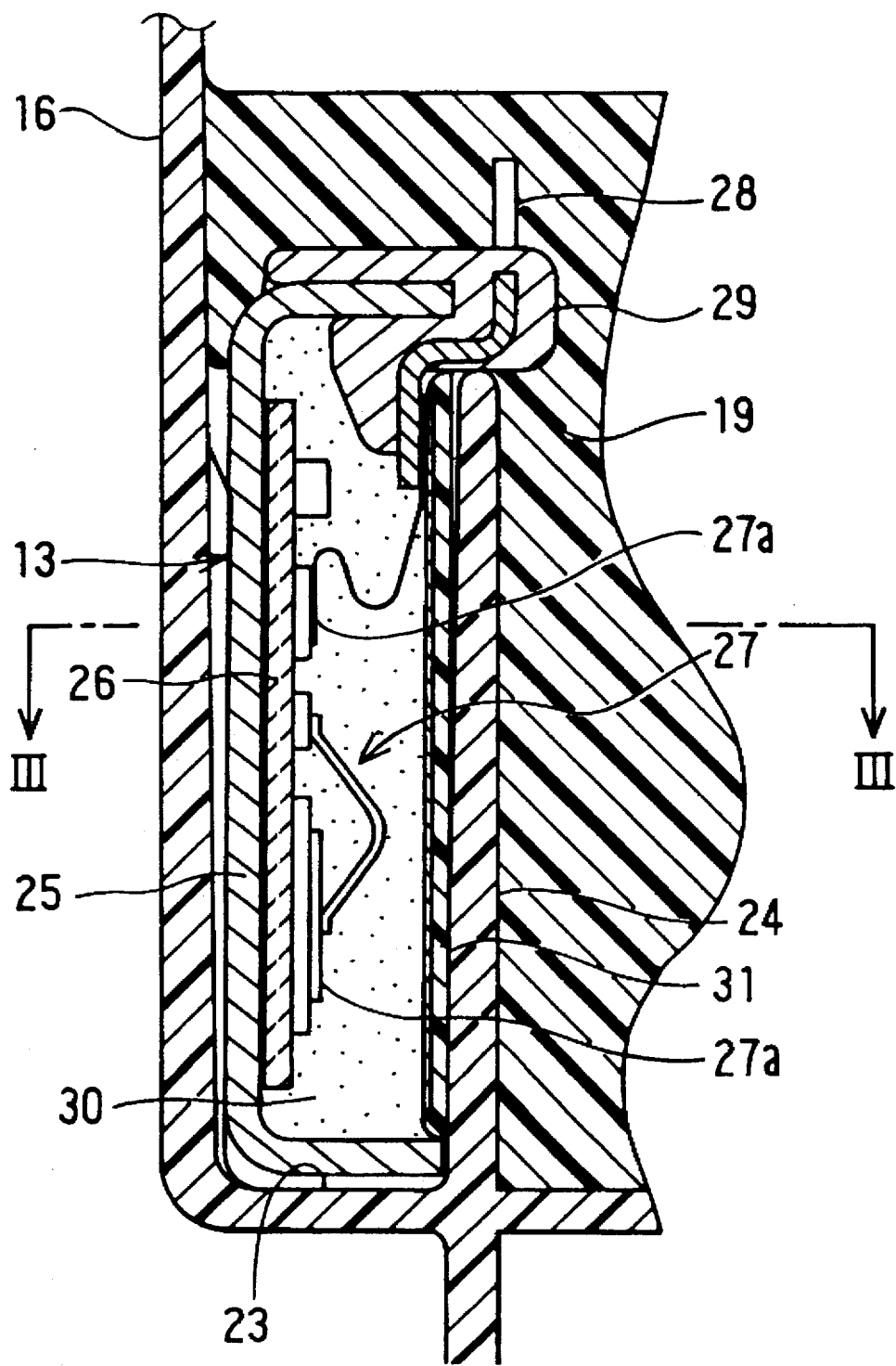
FIG. 2 is an enlarged vertical cross-sectional view of a circuit accommodation portion of the ignition device.

Furthermore, as shown in FIG. 2, a partition wall 24 which defines a circuit accommodation portion 23 is formed at one side of the sealing container 16. The circuit accommodation portion 23 has an opening at a top surface thereof and the igniter 13 is placed inside the circuit accommodation portion 23 via the opening.

The igniter 13 has the following construction. A circuit substrate 26, which may be a ceramic substrate or the like, is bonded to an inner bottom surface of a shallow metallic circuit housing 25 of the igniter 13 using an adhesive. Various circuit elements 27a that form an ignition circuit 27 (which is the electric circuit portion of the igniter 13) are mounted on the circuit substrate 26. A connector 29 having a plurality of external connection terminals 28 is provided at a top end portion of the circuit housing 25. Each of the external connection terminals 28 is connected to a conduction pattern (not shown) of the circuit substrate 26. The ignition circuit 27 causes the ignition coil 12 to produce a high voltage in the secondary coil 15 by interrupting the flow of primary current to the primary coil 14 in synchronization with an ignition timing signal received from the primary terminal 21 via the external connection terminals 28. The ignition coil 12 applies the high voltage to a spark plug (not shown) via the secondary terminal 22 to produce electrical sparks. It must be noted that both the primary coil 14 and the secondary coil 15 are fixed inside the sealing container 16 by first vacuuming the sealing container 16 and subsequently filling it with an insulating resin 19 such as epoxy resin or the like.

The ignition circuit 27 includes at least a semiconductor switching element for controlling the flow of primary current. Furthermore, the ignition circuit 27 may also have a current controller for controlling the primary current to be at a predetermined level, an ignition state detector for producing detection signals indicative of ignition and non-ignition states of the spark plug, and the like.

Meanwhile, the igniter 13 is assembled in the following manner. After being vacuumed, the circuit housing 25 of the igniter 13 is filled with transparent silicone gel 30. This silicone gel 30 seals the ignition circuit 27 mounted on the circuit substrate 26. The silicone gel 30, which has excellent fluidity at the time of filling, ensures the high sealability of the ignition circuit 27 because it covers all the circuit element 27a. The silicone gel 30 also remains highly elastic even after being cured and is thermally stable in that it emits no heat to the circuit element 27a even if it is subjected to high temperatures. Furthermore, the silicone gel 30 remains adhesive even after being cured and thus, because of its adhesiveness, a sheet-like protective member 31 can adhere to (i.e., be in contact with) a surface of the silicone gel 30 that is facing the opening of the circuit housing 25. The protective member 31 is placed on the layer of silicone gel 30 so that it is proximate to and faces the partition wall 24 of the circuit accommodation portion 23.

The protective member 31 is preferably made up of a material which is:

1) highly adhesive to silicone gel 30;
2) capable of containing gas (air); and
3) elastic.

A material adhesive to silicone gel 30 may be, for example, a material which is inherently adhesive to the silicone gel 30 or a material (for example, fibrous paper or cloth) which has a number of tiny irregular portions that enhances its adhesiveness to the silicone gel 30 by making a portion of the silicone gel 30 fill its tiny irregular portions. A material that can contain gas (air) may be, for example, a material that is made up of fibers or a porous material which has numerous tiny holes. An elastic material may be, for example, a paper, film or membrane material which can change its shape to conform with the contours of the surface of the silicone gel 30. In the present embodiment, the protective member 31 may be made of, for example, aramid paper which possesses all of the three qualities mentioned above.

Figure 3A:
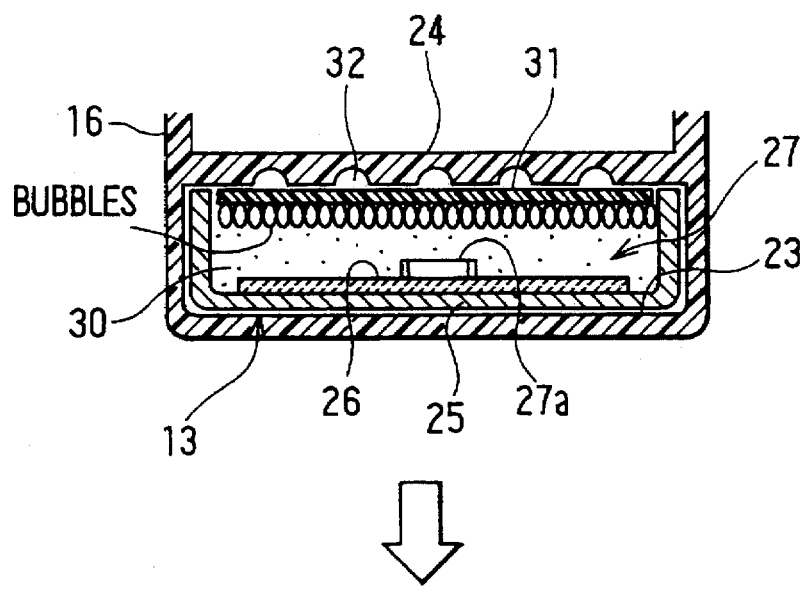
FIGS. 3A–3C are cross-sectional views of the circuit accommodation portion according to the embodiment as seen from line III—III of FIG. 2 during an insulating resin filling process.
Figure 3B:
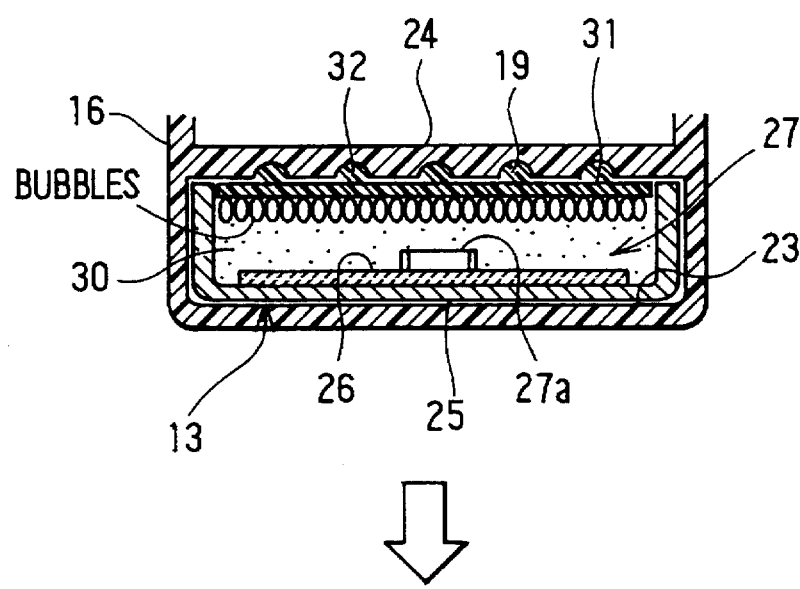
Figure 3C:
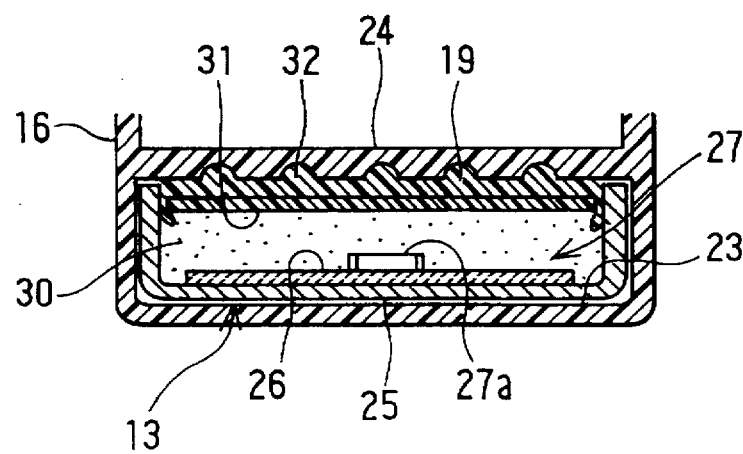

As shown in FIGS. 3A–3C, a plurality of grooves 32 are formed at an inner surface of the partition wall 24. These grooves 32 extend along the longitudinal direction of the partition wall 24 to face the protective member 31. Each groove 32 has a top end opening (FIG. 3A). When the sealing container 16 is filled with the insulating resin 19 while the sealing container 16 is in a vacuum state (FIG. 3B), a part of the insulating resin 19 flows from the top end opening of each of the grooves 32 to seep to crevices of the circuit accommodation portion 23 (FIG. 3C). In other words, these grooves 32 improve the flow of insulating resin 19 into the interior of the circuit accommodation portion 23.

Instead of having a plurality of grooves 32, it must be noted that it suffices to have only one groove 32. Furthermore, instead of forming the groove 32, a slit that penetrates through the partition wall 24 or a separate hole may be formed for introducing the insulating resin 19 between the partition wall 24, which is acting as the cover of the igniter 13, and the protective member 31. However, it is preferable to have a groove 32 considering the amount of pressure it exerts on the protective member 31 and because it can be easily formed.

The ignition coil 12 and the igniter 13 are placed inside the sealing container 16 before the same sealing container 16 is filled with the insulating resin 19. The sealing container 16 is placed inside a vacuum tank (not shown) to remove air from it. At this state, as shown in FIG. 3A, because vacuum pressure is exerted on the surface of the silicone gel 30 that fills the circuit housing 25 of the igniter 13, bubbles are produced with the expansion of a small amount of gaseous components (air) inside the silicone gel 30. These bubbles appear at the surface of the silicone gel 30. While the filling of silicone gel 30 into the circuit housing 25 is carried out under a vacuum condition to reduce the amount of gaseous components in the silicone gel 30, a small amount of gaseous components still remains inside the silicone gel 30.

Figure 4A:
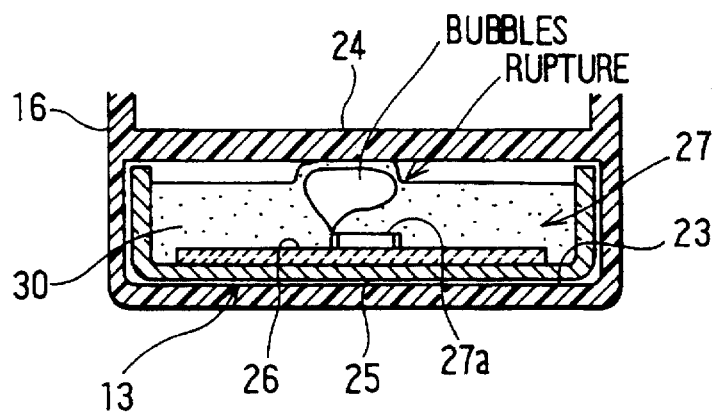
FIGS. 4A–4C are cross-sectional views of the circuit accommodation portion of a comparative exemplary device during the insulating resin filling process.
Figure 4B:
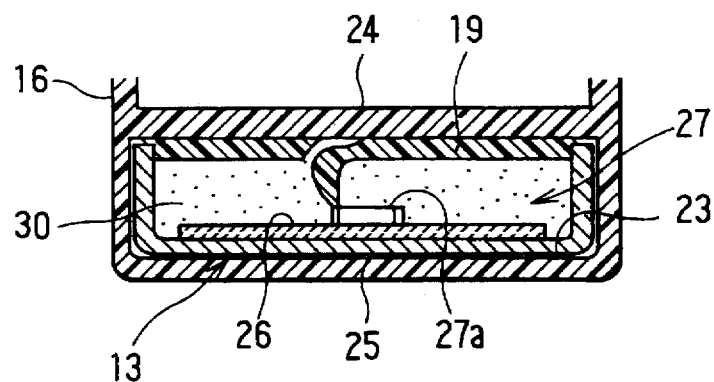
Figure 4C:
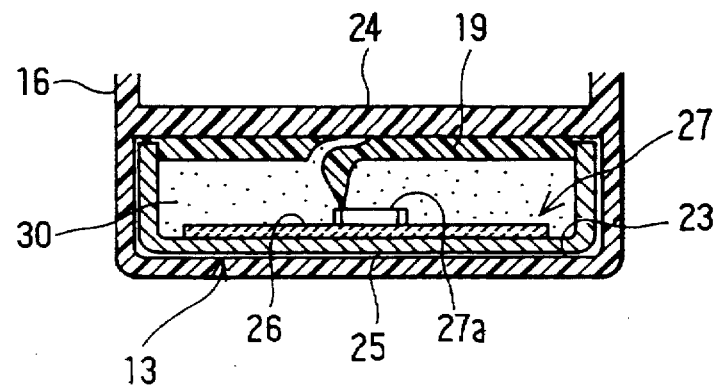

Meanwhile, in comparison, the case in which no protective member 31 is provided on the surface of the silicone gel 30 is explained hereinafter. As shown in FIGS. 4A–4C, if there is no protective member 31 provided on the surface of the silicone gel 30 and the surface of the silicone gel 30 is directly exposed to the partition wall 24, bubbles produced in the silicone gel 30 during the removal of air protrude outwardly from the surface of the silicone gel 30. As shown in FIG. 4A, these bubbles bump against the partition wall 24 and eventually rupture. When some of the bubbles rupture, a portion of the silicone gel 30 scatters and adheres to the partition wall 24 and thus, a cave-in or a crack is produced on the layer of the silicone gel 30. When the insulating resin 19 is filled into the circuit housing 25 under this condition, a portion of the insulating resin 19 enters the interior of the sealing layer of the silicone gel 30 from the cave-in or the crack produced by the rupture of the bubbles. The insulating resin 19 then hardens with a portion of it being in contact with the circuit element 27a or the like of the ignition circuit 27 which thereby reduces the reliability of the ignition circuit 27.

In comparison with the above-described arrangement, the present embodiment, as shown in FIGS. 3A–3C, provides the silicone gel 30 with the protective member 31 that is firmly adhered to its entire surface. The protective member 31, which is made up of, for example, aramid paper, adheres to the surface of the silicone gel 30, can easily contain gas (air) and is elastic enough to be able to conform with the contours of the gel surface of the silicone gel 30. When air is removed from the sealing container 16, the gas (air) contained inside the protective member 31 is sucked out due to the surrounding vacuum pressure. This increases the pressure of the surface of the silicone gel 30 and thus reduces the vacuum pressure acting on the gel surface. Therefore, even if a lot of bubbles are produced and are spread across the whole bottom surface of the protective member 31, each air bubble will be small in size. Furthermore, because the protective member 31 is proximate to and is facing the partition wall 24, outward movements and changes in the shape of the protective member 31 are inhibited by the partition wall 24. Thus, the bubbles produced in the silicone gel 30 are inhibited from expanding outside of the gel surface. With the bubbles having small sizes, the rupture of the bubbles at the gel surface is effectively prevented and thus, cave-in or cracks in the sealing layer of the silicone gel 30 can be reliably prevented.

Moreover, the protective member 31 changes its shape in accordance with the change in shape of the gel surface of the silicone gel 30 during the removal of air and adheres close to the gel surface. When the sealing container 16 is filled with the insulating resin 19 while it is in a vacuum state, the protective member 31 completely separates the silicone gel 30 from the insulating resin 19 flowing from the top opening of the grooves 32 of the partition wall 24. In other words, the protective member 31 prevents the insulating resin 19 from entering its inner side (gel surface side) and thus, the protective member 31 protects the gel surface of the silicone gel 30 from the insulating resin 19. Because of the gel surface protective and bubble rupture preventive effect of the protective member 31, the reliability of the ignition circuit 27 can be maintained at a very high level.

Because small crevices exist between the periphery of the protective member 31 and the circuit housing 25, a small amount of the insulating resin 19 enters from these small crevices. However, the amount of insulating resin 19 entering these crevices is extremely small and will never reach the ignition circuit 27, and thus, the reliability of the ignition circuit 27 will not be affected.

When the sealing container 16 is exposed to atmospheric pressure after it is filled with the insulating resin 19, the bubbles produced at the bottom surface of the protective member 31 are reduced in size and disappear, and thus, the sealing layer of the silicone gel 30 will return to its original state, which is the state before the removal of air from it.

Although the present invention is applied to the ignition device in the above-described embodiment, the present invention may be applied not only to the ignition device but also to other various types of electric circuit devices.

For example, the present invention can be applied to a device in which the circuit housing 25 sealed by the silicone gel 30 is assembled together with a cover that is integrally formed with a connector. Here, the assembled body is fixed to a coil bobbin and soaked inside the insulating resin 19. In this case, in the same way as that of the present embodiment, the protective member 31 is placed over surface of the silicone gel 30 before covering with the cover and the insulating resin 19 is made to flow between the cover and the protective member 31. Thus, the circuit elements inside the circuit housing 25 are solidly held using the insulating resin 19 while at the same time preventing the insulating resin 19 from reaching the circuit elements inside the circuit housing 25. In this way, the reliability of the circuit elements can be maintained at a high level. Therefore, it is important to have a member (for example, the partition wall 24) that will act as a cover for covering the opening of the circuit housing 25 and to make the insulating resin 19 enter the space between the cover and the protective member 31 while making the cover prevent excessive movement in the protective member 31.

Although the present invention has been fully described in connection with a preferred embodiment thereof with reference to the accompanying drawings, it is to be noted that various changes and modifications will become apparent to those skilled in the art. Such changes and modifications are to be understood as being within the scope of the present invention as defined by the appended claims.

What is claimed is:

1. An electric circuit device comprising:

a container having an opening and a bottom opposite said opening;

a circuit element placed inside said container via said opening;

a gel medium filling said container sufficiently to seal said circuit element; and a protective member contacting an entire surface of said gel medium proximate to said opening, said protective member sealing said entire surface of said gel medium against substantial contact with an overlying potting medium, wherein said circuit element is disposed between a surface of said protective member and said bottom.

2. An electric circuit device as in claim 1, wherein said protective member is adhesive with respect to said gel medium.

3. An electric circuit device as in claim 1, wherein said protective member is flexible and elastic.

4. An electric circuit device as in claim 1, wherein said protective member can contain gas.

5. An electric circuit device as in claim 1, further comprising:

a structure disposed proximate to said protective member to inhibit its movement.

6. An electric circuit device as in claim 5, wherein:

said gel medium is silicone gel; and said protective member comprises aramid.

7. An electric circuit device as in claim 5, wherein said structure has at least one groove formed at a surface proximate said protective member.

8. An electric circuit device as in claim 1, wherein:

said gel medium is silicone gel; and said protective member comprises aramid.

9. An electric circuit device comprising:

a housing which includes an internal partition wall;

a circuit unit placed proximate said partition wall and having a circuit case with a bottom located opposite an opening which is obstructed by said internal partition wall;

a circuit element disposed inside said circuit case;

a gel medium filling said circuit case to seal said circuit element; and a protective member contacting said gel medium and disposed between said internal partition wall and said gel medium, said protective member sealing a surface of said gel medium proximate to said internal partition wall, wherein said circuit element is disposed between a surface of said protective member and said bottom.

10. An electric circuit device as in claim 9, further comprising:

insulating resin filling said housing.

11. An electric circuit device as in claim 10, wherein said protective member adheres to said gel medium to seal said gel medium from said insulating resin.

12. An electric circuit device as in claim 9, wherein said protective member is flexible and elastic.

13. An electric circuit device as in claim 9, wherein said protective member can contain gas.

14. An electric circuit device as in claim 10, further including art ignition coil which is sealed by said insulating resin;

wherein said circuit unit is a driver circuit for driving said ignition coil.

15. An electric circuit device as in claim 9, wherein:

said gel medium is silicone gel; and said protective member comprises aramid.

16. An electric circuit device as in claim 9, wherein said internal partition wall has at least one groove formed at a surface proximate to said protective member.

17. An ignition device comprising:

a housing which includes a coil accommodation portion and an internal partition wall that defines a circuit unit accommodation portion;

an ignition coil disposed inside said coil accommodation portion;

an igniter disposed inside said circuit unit accommodation portion, said igniter being for driving said ignition coil, said igniter having an igniter case that has an opening and a bottom opposite said opening, said internal partition wall obstructing the opening of said igniter case;

an igniter element disposed inside said igniter case;

a gel medium filling said igniter case to seal said igniter element;

an insulating resin medium filling said housing; and a protective member contacting a surface of said gel medium proximate to said internal partition wall, said protective member sealing said gel medium from said insulating rosin medium, wherein said circuit element is disposed between a surface of said protective member and said bottom of the igniter case.

18. A hermetically sealed electric circuit device comprising:

a container having an electric circuit disposed therein;

said container having an opening and being filled with an insulating gel to a surface level that seals said electric circuit within the container;

a flexible protective membrane adhered to substantially the entirety of said surface level of the gel medium; and a potting medium disposed over said container and protective membrane which prevents substantial contact between said gel medium and said potting medium thereby better protecting the electric circuit from contact with the potting medium via imperfections in the gel medium that may otherwise occur during placement of the potting medium.

19. A hermetically sealed electric circuit device as in claim 18 further comprising:

a fixed relatively rigid wall located opposite and proximate an outer surface of the flexible protective membrane to restrain it, and the underlying gel medium, from undue motion during placement of the potting medium in a vacuum environment including potting medium flowing between the wall and the protective membrane.

20. A hermetically sealed electric circuit device as in claim 19 wherein said wall includes at least one passageway proximate said protective membrane for accommodating the flow of potting medium therethrough.

21. A hermetically sealed electric device as in claim 18 wherein:

said gel medium includes a silicone gel; and said potting medium includes an epoxy.

22. A hermetically sealed electric device as in claim 21, wherein:

said flexible protective membrane includes an aramid paper.

23. A method for hermetically sealing an electric circuit device, said method comprising:

placing an electric circuit into an open container;

filling said container through said opening with a liquid insulating gel medium up to a level that encapsulates the electric circuit and then curing said gel to a solid but flexible state;

adhering to the exposed surface of the gel a flexible protective membrane to protect the gel and its top surface from subsequent disruption; and potting at least the opening of said container in a reduced pressure environment with a potting medium whereby the gel medium is protected by said membrane from disruption during said potting step.

24. A method as in claim 23 further comprising the step of placing the exposed surface of the protective membrane covering said opening adjacent a fixed wall structure during said potting step to suppress undue movement of the membrane and underlying gel during said potting step.

25. A method as in claim 24 further including the passage of some of said potting medium between said fixed wall and said protective membrane via at least one passageway formed in said wall.

26. A method as in claim 23 wherein:

said gel medium includes a silicone gel; and said potting medium includes an epoxy.

27. A method as in claim 26 wherein:

said flexible protective membrane includes an aramid paper.

* * * * *